(12) United States Patent
Chen et al.

(10) Patent No.: US 11,665,872 B2
(45) Date of Patent: May 30, 2023

(54) EMF RADIATION PROTECTION DEVICES

(71) Applicant: DIMENSION 0 LLC, Saratoga, CA (US)

(72) Inventors: Yuhui Chen, Saratoga, CA (US); Ainslie Chen, Saratoga, CA (US); Xin Shao, Saratoga, CA (US)

(73) Assignee: Dimension 0 LLC, Saratoga, CA (US)

( * ) Notice: Subject to any disclaimer, the term of this patent is extended or adjusted under 35 U.S.C. 154(b) by 0 days.

(21) Appl. No.: 17/729,355

(22) Filed: Apr. 26, 2022

(65) Prior Publication Data

US 2022/0346290 A1    Oct. 27, 2022

Related U.S. Application Data

(60) Provisional application No. 63/179,970, filed on Apr. 26, 2021.

(51) Int. Cl.
*H05K 9/00* (2006.01)

(52) U.S. Cl.
CPC .......... *H05K 9/0049* (2013.01); *H05K 9/005* (2013.01)

(58) Field of Classification Search
CPC .................................................. H05K 9/0049
See application file for complete search history.

(56) References Cited

U.S. PATENT DOCUMENTS

2006/0005981 A1\*  1/2006  Loeffelholz .......... H05K 9/0062
                                                                174/50
2021/0243925 A1\*  8/2021  Ramasamy .......... H01Q 1/2266

\* cited by examiner

*Primary Examiner* — Hung V Ngo
(74) *Attorney, Agent, or Firm* — Profound Law LLP

(57) ABSTRACT

An Electric and Magnetic Fields (EMF) protection device, includes: a metallic bottom; a metallic side extending from the metallic bottom; and a top opening, wherein the metallic bottom and the metallic side form a cylinder enclosure configured to substantially block a signal passing through the metallic side and the metallic bottom and allow the signal to pass only through the top opening.

18 Claims, 7 Drawing Sheets

EMF RADIATION PROTECTION DEVICES

CROSS-REFERENCES TO RELATED APPLICATIONS

This application is a non-provisional application that claims priority to U.S. Provisional Application No. 63/179,970, entitled "EMF RADIATION PROTECTION DEVICES," filed on Apr. 26, 2021, which is incorporated herein by reference in its entirety.

TECHNICAL FIELD

The present disclosure relates generally to a device that protects its user from Electric and Magnetic Fields (EMF) radiated by wireless electronics and, more specifically, to an EMF protection device without impairing wireless electronics' connectivity, and to an EMF protection device with a foolproof design to avert user's misuses.

BACKGROUND

Electric and Magnetic Fields (EMF) are invisible areas of energy, often referred to as radiation. Low-level EMF radiation is generally perceived as harmless to humans, while high-level EMF radiation may have the potential for cellular and DNA damage. The International Agency for Research on Cancer (IARC) has classified radio frequency electromagnetic fields as possibly carcinogenic to humans (Group 2B), based on an increased risk for glioma, a malignant type of brain cancer, associated with wireless phone use. In the age of ubiquitous smart phones, wireless routers, and the Internet of Things, all of which use EMF for signal transmission, the continuous exposure to the EMF may still have adverse impact on human body. Therefore, solutions to reduce exposures to EMFs are critical for human health in modern life.

SUMMARY

The technologies regarding an EMF protection device without impairing wireless connectivity are disclosed.

An Electric and Magnetic Fields (EMF) protection device includes a metallic bottom, a metallic side extending from the metallic bottom, and a top opening, wherein the metallic bottom and the metallic side form an enclosure configured to substantially block a signal passing through the metallic side and the metallic bottom and allow the signal passing through the top opening.

In some implementations, the EMF protection device further includes a non-metallic closure covering the top opening.

In some implementations, the EMF protection device further includes a combination of metallic and non-metallic materials covering part or entirety of the top opening.

In some implementations, the EMF protection device further includes a pattern of the metallic bottom and the metallic side comprises a wire mesh or a metal plate.

In some implementations, the EMF protection device further includes an enhancement formed at the non-metallic closure, wherein the enhancement is of a directional open cone extending inward.

In some implementations, the EMF protection device further includes multiple enhancements formed at the non-metallic closure and arranged in an array, wherein the enhancements form a cone array comprising multiple cones.

In some implementations, each cone has a diameter of 0.1 inches to 5 inches.

In some implementations, each cone has a depth of 0.1 inches to 5 inches.

In some implementations, the EMF protection device further includes a base structure including an extended portion extending out of the metallic bottom.

In some implementations, the base structure includes conducting materials including Mn, Zn, Al, Cu, Fe, or the like, or a combination thereof.

In some implementations, a material of at least one of the metallic bottom and the metallic side includes conducting materials including Mn, Zn, Al, Cu, Fe, or the like, or a combination thereof.

In some implementations, a shape of the EMF protection device is a cylinder, cone, sphere, or any combination thereof.

In some implementations, the metallic bottom, the metallic side, and the top opening form a telescopic cylinder.

In some implementations, an area of the metallic bottom is larger than that of the top opening.

In some implementations, the EMF protection device is configured to surround a wireless device or wireless devices including a cellphone, a tablet, or a wearable device.

In some implementations, the EMF protection device further includes a wired or wireless charger configured to charge the battery of the wireless devices placed inside the EMF protection device.

In some implementations, the EMF protection device further includes a lighting configured to serve as a lamp or a night light.

In some implementations, the EMF protection device further includes a position sensor configured to alert the user in response to the EMF protection device is placed in a wrong direction.

In some implementations, the signal is a cellular, WiFi, or Bluetooth signal.

In some implementations, the EMF protection device further includes a housing, and sections of a retractable body, wherein the EMF protection device is configured to be movable along a depth direction from a retracted position in which the sections of the retractable body are all contained by the housing, a semi-extended position in which parts of the sections of the retractable body are contained by the housing, and a fully extended position in which all sections of the retractable body extend upwardly.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Figure 1:
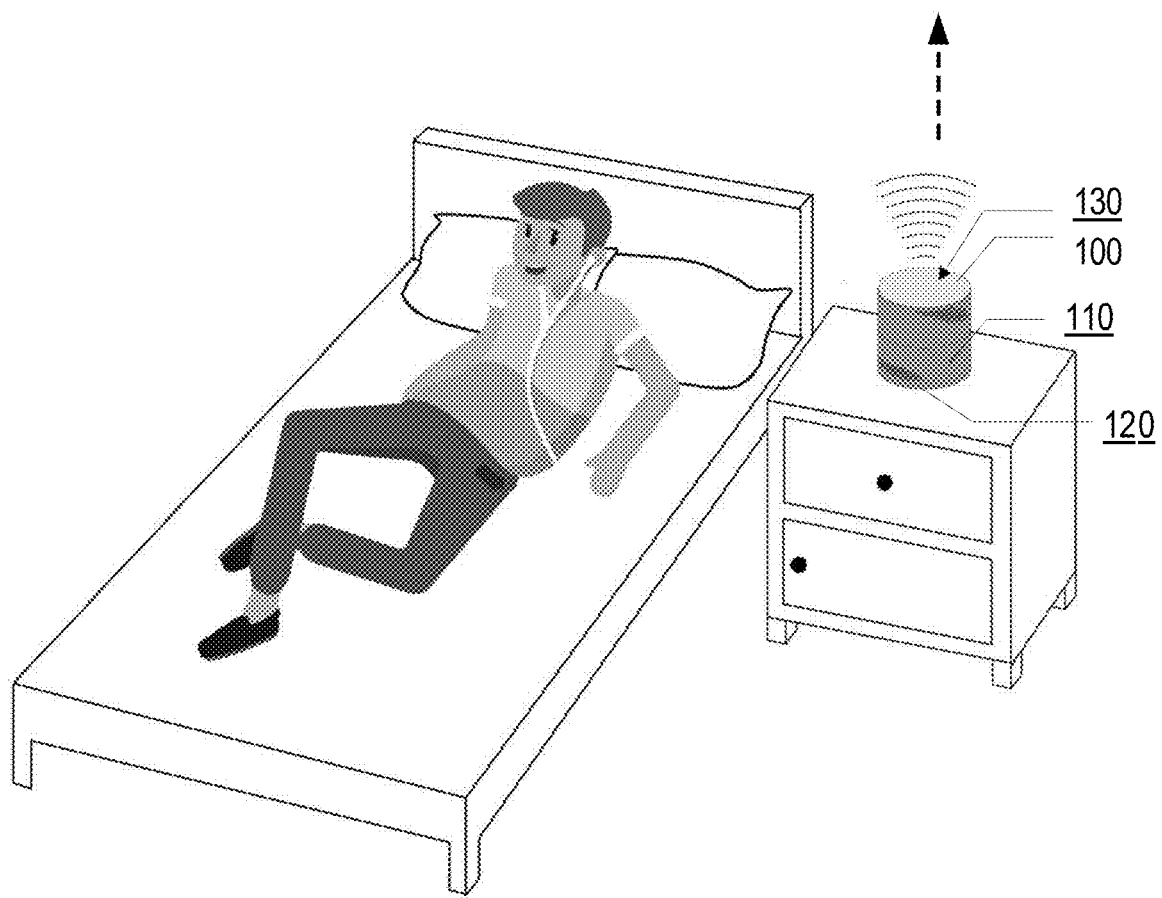
FIG. 1 is a schematic diagram illustrating an EMF protection device placed on a nightstand beside a bed in accordance with some implementations of the present disclosure.

Electric and Magnetic Fields (EMF) may be harmful to human health. However, people are increasingly dependent on wireless electronics (for example: cellular phones, tablets and smart watches) and an overwhelming portion of the general population puts their wireless gadgets in close proximity when they go to sleep. As the distance to the transmitter decreases, the intensity of radiation increases. Therefore, having a wireless gadget in close proximity (such as on a bedside stand) makes its user more susceptible to EMF radiation's detrimental effect. Compounding such high intensity with long hours' exposure (such as during sleep every day) further exacerbates the harm.

EMF exposure can be prevented by putting the wireless gadgets in, for example, a Faraday cage, which is a container made of continuous conductive materials or a mesh of such materials. However, a Faraday cage also prevents the wireless gadgets from receiving EMF signals, effectively disabling the gadgets' wireless connectivity. A cellular phone, for instance, will not be able to receive calls or other wireless messages once put inside such a container. As many people depend on wireless devices for always-on communication, it is undesirable for these users to lose their wireless connectivity even during sleep.

The disclosed technologies are directed to overcoming one or more of the problems set forth above and/or problems.

Moreover, the disclosed technologies take human factors into design considerations. They prevent users from placing the EMF protection device in a wrong position or in a wrong direction, hence eliminate the risk of unintended EMF exposure and solidify the device's overall effectiveness in real-world applications.

In light of the problems associated with conventional EMF protection methods, it would be desirable to provide a solution that does not impair the connectivity of the wireless devices placed inside the EMF protection device. Furthermore, it would be desirable to incorporate human factor engineering in the design consideration to make the EMF protection device foolproof.

First, it allows wireless devices (e.g., cellphones and tablets) to continue to receive EMF signals from external sources (e.g., phone calls and message alerts), while protecting users from EMF exposure during their sleep.

Second, it prevents wireless devices from radiating EMF in any other direction except upwards from top of the EMF protection device. In particular, the top of the EMF protection device is designed to be higher than the user lying in bed.

Third, to prevent people from placing the EMF protection device in a wrong position, it is designed to be cylindrical, as opposed to cuboid or prism. Other feasible shapes may include elliptic cylinder, cone and sphere, with or without an extended base, or any combination thereof, e.g., a cone-like shape with a flat top, a sphere with a flat bottom, any 3-dimensional structure with an extended flat base.

Last, it allows audible sound (e.g., alarm clock) to be heard from outside the EMF protection device.

FIG. 1 is a schematic diagram illustrating an EMF protection device placed on a nightstand beside a bed in accordance with some implementations of the present disclosure.

As illustrated in FIG. 1, an EMF protection device 100 is provided to direct the EMF radiation away from people sleeping in bed. In some implementations, EMF protection device 100 directs the EMF radiation in a direction toward an upward direction and at least not parallel to the horizontal line. In some implementations, it includes a cylindrical container where its side 110 and bottom 120 are made of metallic materials (either solid or mesh) to prevent EMF radiation in those directions. The top 130 of EMF protection device 100, on the other hand, is made of non-metallic materials (or open) to allow wireless signals to enter and exit in the upward direction. Therefore, a cellular phone or other wireless devices placed in EMF protection device 100 can still receive wireless signals while preventing its user(s) from EMF exposure when the user(s) is lying in the bed.

In some implementations, the bottom and/or the side of EMF protection device 100 is made of conducting materials including Mn, Zn, Al, Cu, Fe, and/or the like, or a combination thereof. It can also be composed of compounds or alloys such as Fe—Si, or Fe—Ni.

In some implementations, a pattern of the bottom and/or the side of EMF protection device 100 includes wire meshes, metal plates, or a combination thereof (e.g., a combination of wire meshes and solid metal plate).

In some implementations, the bottom and/or the side of EMF protection device 100 is connected to a capacitor(s) which serves as a virtual ground at the radio frequency. As such, the capacitor is configured to collect the radiation-induced electrons, or connect them to ground.

In some implementations, the top of EMF protection device 100 is either non-metallic or uses a combination of metallic and non-metallic (including open air) materials so that it does not shield EMF signals.

Figure 2:
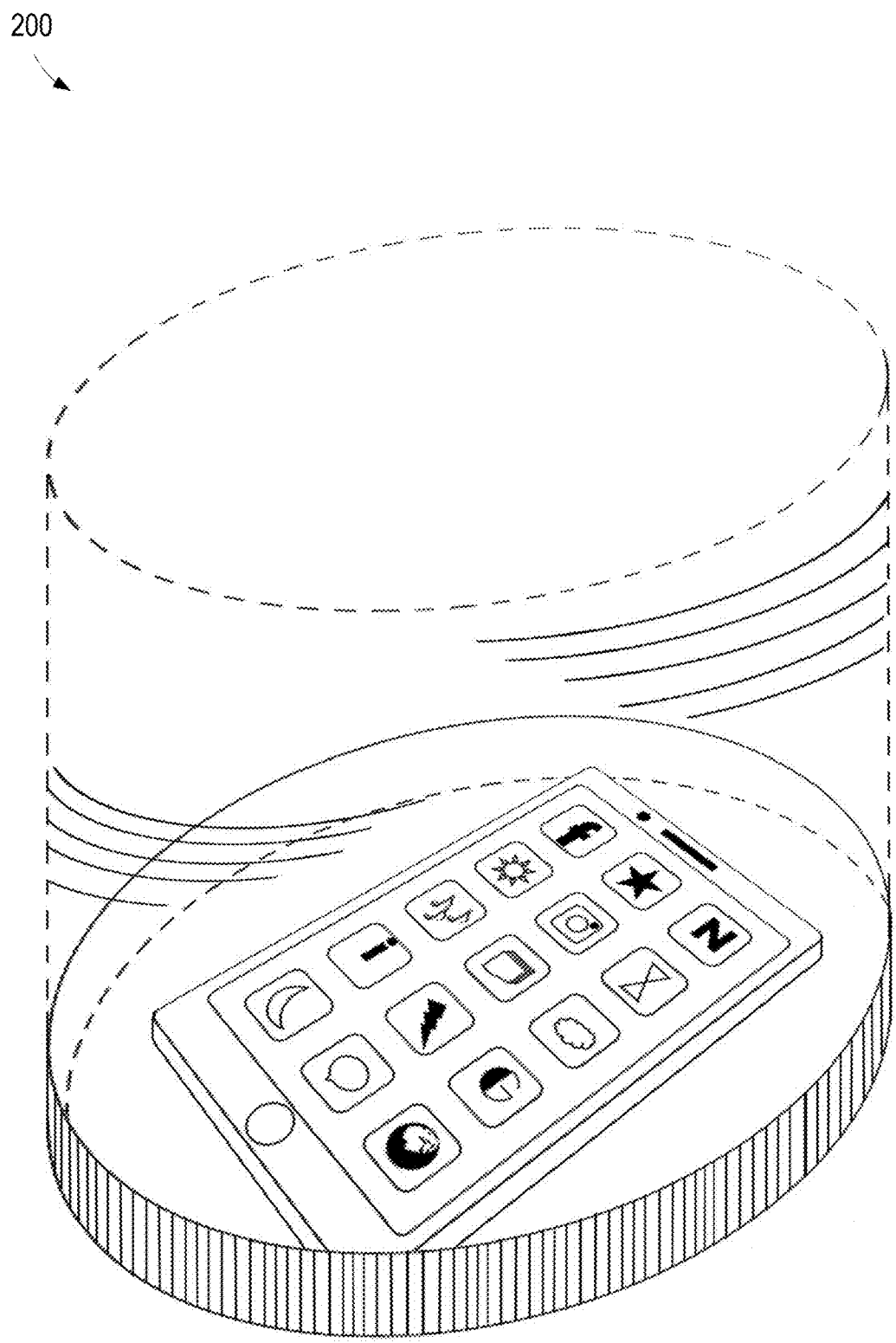
FIG. 2 is a schematic diagram illustrating an EMF protection device in accordance with some implementations of the present disclosure.

FIG. 2 is a schematic diagram illustrating an EMF protection device 200 in accordance with some implementations of the present disclosure. There are several features of EMF protection device 200. First, EMF protection device 200 (e.g., corresponding to EMF protection device 100) allows wireless devices or any device that is designed to receive EMF signals (e.g., cellphones, tablets, wearable electronics, and/or the like), to continue to receive EMF signals from external sources (e.g., phone calls, message alerts, and/or the like). Second, EMF protection device 200 prevents the wireless devices from transmitting EMF in any other direction except upwards from top of EMF protection device 200, to avoid radiation in the direction directly towards any person especially when he or she is at sleep or lying on the bed. In some implementations, radiation may be directed in other predetermined directions based on the use case and the user's behavioral pattern in the space. Third, to prevent a user from placing EMF protection device 200 in a wrong position, it is specially designed to be cylindrical, as opposed to cuboid or prism because a cylinder cannot be stably placed on its side. With a cylindrical form factor, a user may not place the device in a wrong direction. Other feasible shapes may include cone and sphere, or any combination thereof, e.g., a cone-like shape with a flat top. The top of the device is designed for EMF signal transmission and reception in the upward direction. Fourth, it allows audible sound (e.g., alarm clock) to be heard from outside EMF protection device 200, i.e., the user can still hear sound and vibration notifications from his or her wireless devices after putting them in EMF protection device 200.

Figure 3:
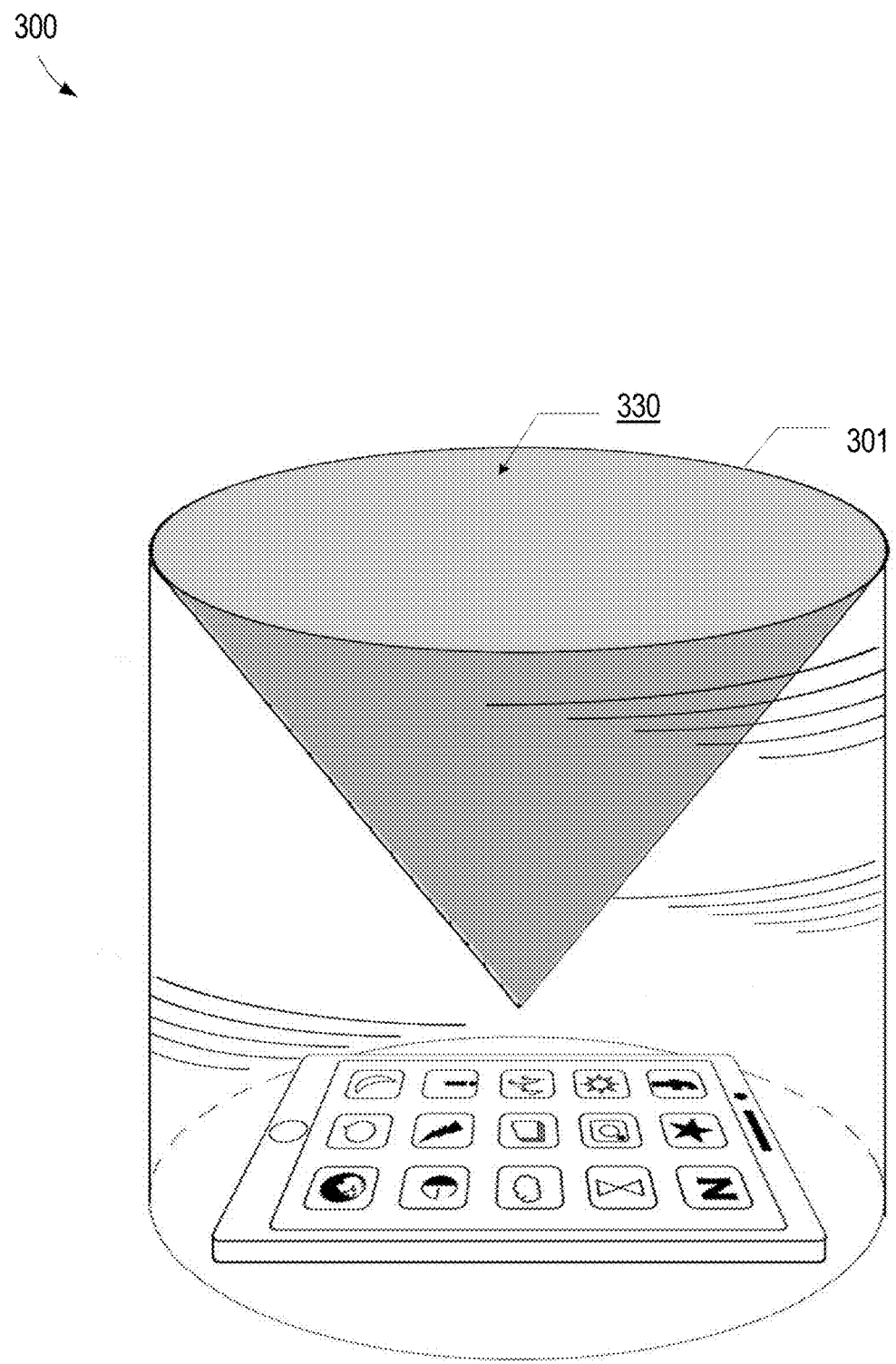
FIG. 3 is a schematic diagram illustrating an EMF protection device with a directional open cone in accordance with some implementations of the present disclosure.

FIG. 3 is a schematic diagram illustrating an EMF protection device with an enhancement in accordance with some implementations of the present disclosure. As shown in FIG. 3, an enhancement 301 can be formed on a top of EMF protection device 300 to improve the signal transmission of the wireless devices inside, and at the same time enhance the directivity of EMF exposure therein. More specifically, an open cone shape design of enhancement 301 is employed at the top 330 of EMF protection device 300. In some implementations, this enhancement 301 may increase audio volume too. In the case of a Faraday cage formed by continuous metallic materials, not only wireless signals but the audio volume is also attenuated. On the contrary, the audio enhancement described here can allow a user to hear the sound of ring tone, alarm clock, and (especially) vibration.

In some implementations, enhancement 301 of EMF protection device 300 is of a reverse circular cone or parabolic shape formed at the top 330 of EMF protection device 300. The directivity (or directionality) of EMF protection device 300 is significantly influenced by its shape. Great directivity can be achieved by the top structure in the shape of horn, dish (or parabolic) and etc.

Figure 4A:
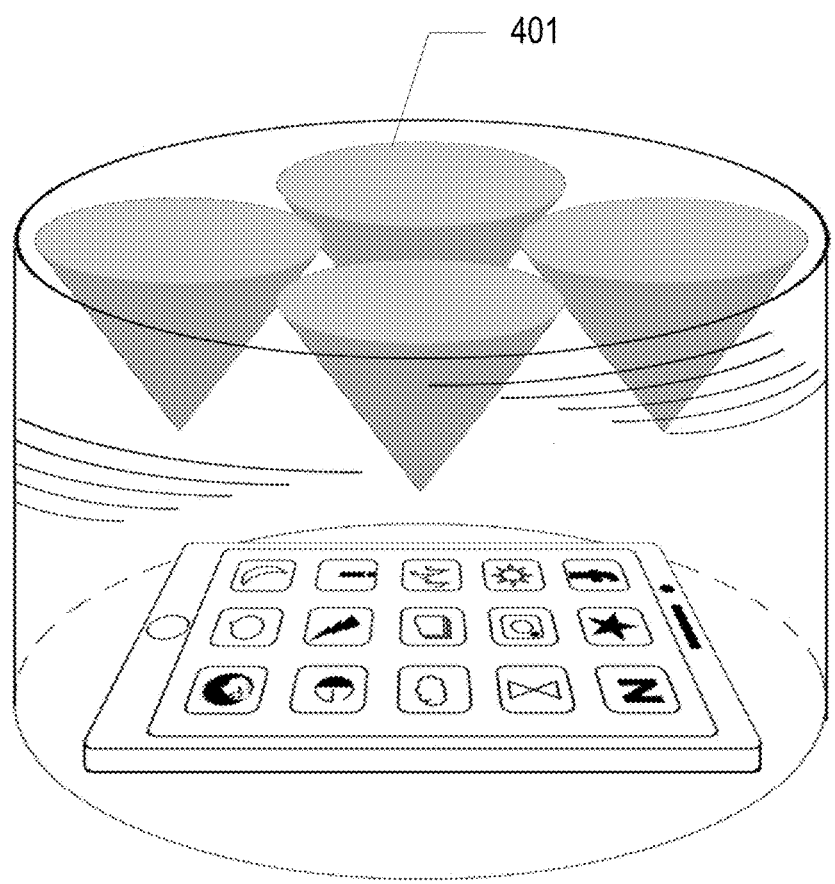
FIG. 4A is a schematic diagram illustrating an EMF protection device with a cone array in accordance with some implementations of the present disclosure.

FIG. 4A is a schematic diagram illustrating an EMF protection device with multiple enhancements in accordance with some implementations of the present disclosure. To further improve directivity and reduce the height of the EMF protection device, an array of open cones 401 is employed instead of one large cone at the top of the device as shown in FIG. 4A. The design with multiple cones (e.g., a cone array) brings the additional benefit of enhanced sensitivity and signal reception. In some implementations, cones 401 in the cone array may include four cones arranged symmetrically. In some implementations, each of cones 401 may have a diameter of 0.1 inches to 5 inches. In some implementations, each of cones 401 may have a depth of 0.1 inches to 5 inches.

Figure 4B:
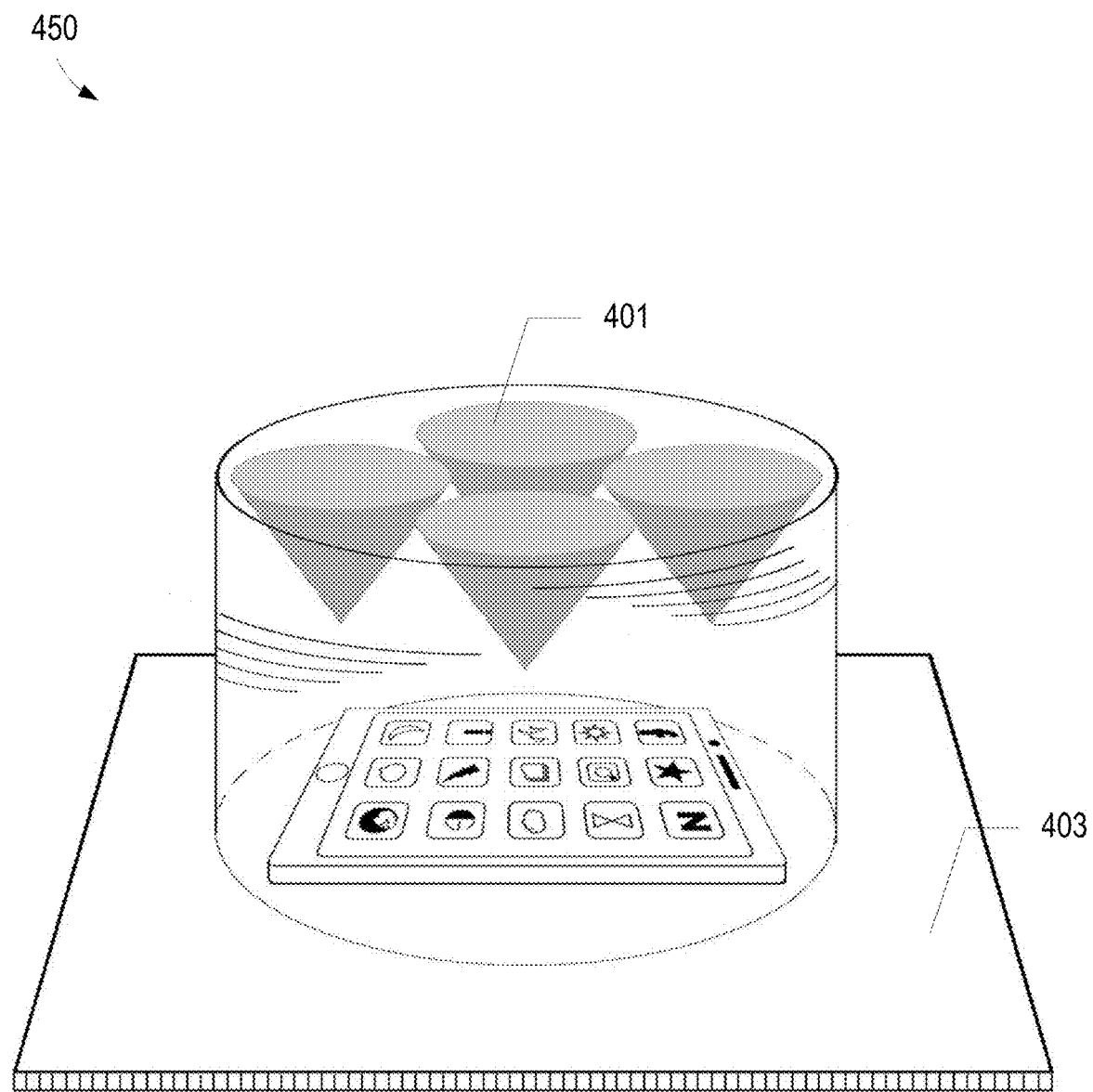
FIG. 4B is a schematic diagram illustrating an EMF protection device with a cone array and a base structure in accordance with some implementations of the present disclosure.

FIG. 4B is a schematic diagram illustrating an EMF protection device 450 with multiple enhancements 401 and a base structure 403 in accordance with some implementations of the present disclosure. Similar to EMF protection device 400, EMF protection device 450 further includes base structure 403. In some implementations, a material of base structure 403 includes conducting materials including Mn, Zn, Al, Cu, Fe, or the like, or a combination thereof. In some implementations, base structure 403 may include an extended portion extending out of the bottom of EMF protection device 450.

Figure 5:
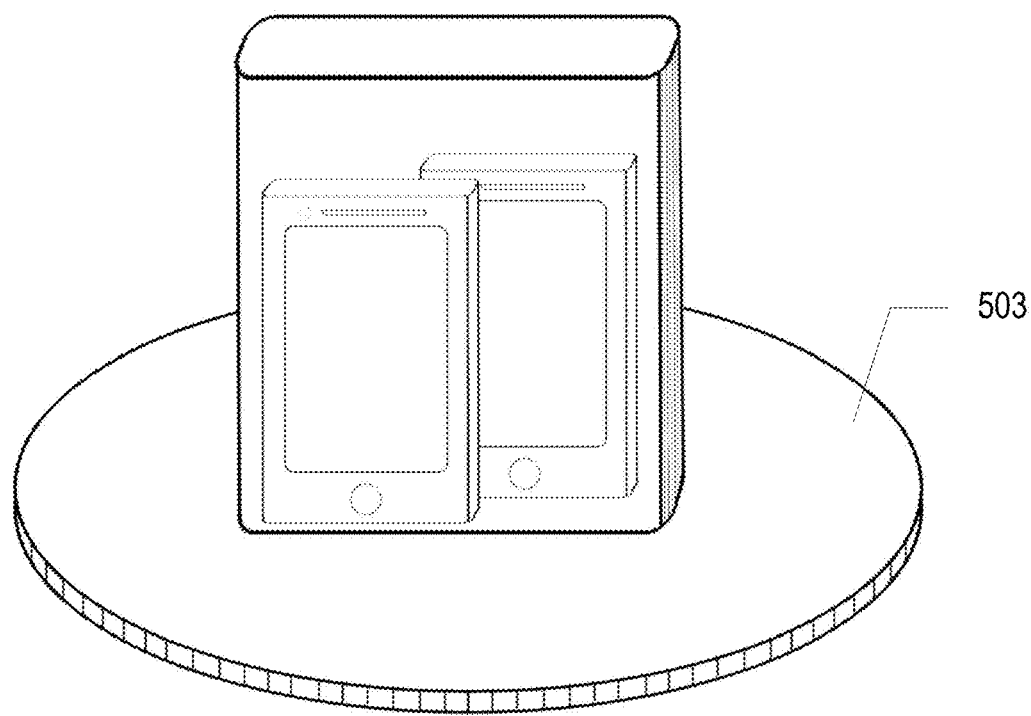
FIG. 5 is a schematic diagram illustrating an EMF protection device in accordance with some implementations of the present disclosure.

FIG. 5 is a schematic diagram illustrating another EMF protection device in accordance with some implementations of the present disclosure. As shown in FIG. 5, EMF protection device 500 with a base structure 503 is provided. EMF protection device 500 may include a cuboid (e.g., a hexahedron) with or without rounded or uneven side surface or side corners. EMF protection device 500 is configured to hold one or more cell phones or tablets within the body of EMF protection device 500. As such, a height of the EMF protection device 500 may be higher than those mobile devices on the market. Also, similar to base structure 403, a material of base structure 503 may include conducting materials including Mn, Zn, Al, Cu, Fe, or the like, or a combination thereof. In some implementations, base structure 503 may include an extended portion extending out of the bottom of EMF protection device 500.

Figure 6:
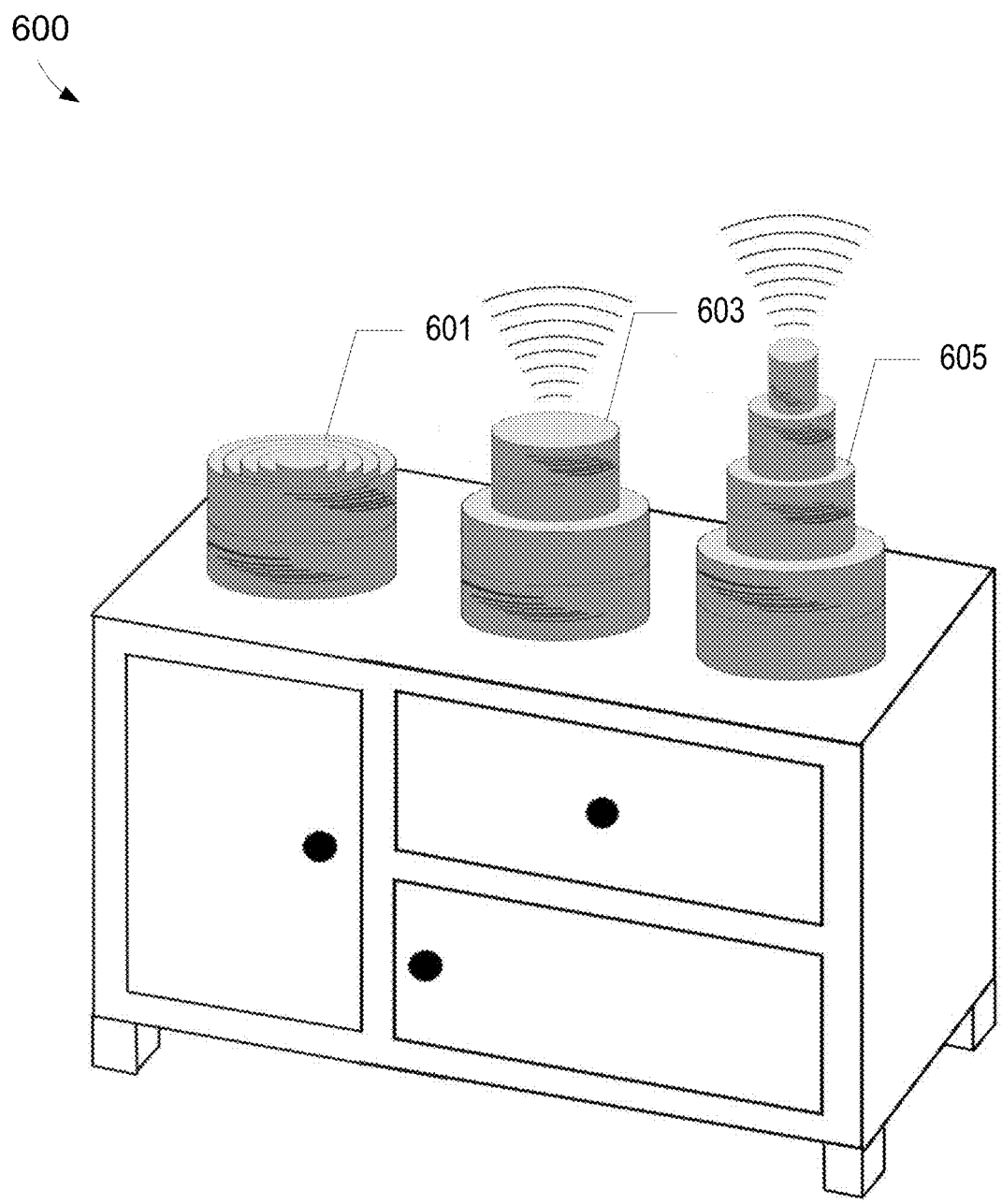
FIG. 6 is a schematic diagram illustrating a multistage retractable EMF protection device in accordance with some implementations of the present disclosure.

FIG. 6 is a schematic diagram illustrating an EMF protection device of a multistage retractable design with some implementations of the present disclosure. As shown in FIG. 6, EMF protection device 600 may include a retractable (e.g., foldable) design, in which the EMF protection device 600 may be movable along a depth direction (e.g., vertical direction) from a retracted position 601 in which sections of EMF protection device 600 are all contained by a housing, a semi-extended position 603 in which some sections of EMF protection device 600 are contained by the housing, and a fully extended position 605 in which all sections of EMF protection device 600 extend upwardly. By having this multistage retractable design, the height of EMF protection device 600 can be adjusted, and the directivity of the EMF can be more concentrated upward. Also, with a multistage retractable top, the signal transmission of mobile phone can still be available via its top. Also, because the relative height between every user's nightstand and bed is different, it is desirable to have a retractable feature for the user to adjust the device's height according to user environment. In some implementations, EMF protection device 600 has the shape of a telescopic cylinder.

In some implementations, the area of the bottom of the EMF protection device is larger than that of the top of the EMF protection device.

In some implementations, when the EMF protection device is provided with an active power source such as a battery and/or electric power plug, additional functions such as battery charger, display and voice alert can be realized.

In some implementations, the metallic part of the EMF protection device is connected to the battery or electric power plug either directly or via a capacitor(s).

In some implementations, the EMF protection device includes a wired and/or wireless battery charger that is configured to charge the battery of wireless devices placed in it.

In some implementations, the EMF protection device includes a lighting to serve the extra function of a lamp or night light.

In some implementations, the EMF protection device includes an active power source that relaxes the design constraints imposed on the passive implementations. The shape, for example, no longer needs to be a cylinder, cone, or sphere. Any shape, including cuboid and prism, will be possible because the EMF protection device may also include a position sensor and a display and/or voice alert that notifies the user when the device is placed in a wrong direction.

Plural instances may be provided for components, operations, or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second column are both columns, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An Electric and Magnetic Fields (EMF) protection device, comprising:
    a metallic bottom;
    a metallic side extending from the metallic bottom;
    a top opening, wherein the metallic bottom and the metallic side form an enclosure configured to substantially block a signal passing through the metallic side and the metallic bottom and allow the signal passing through the top opening; and
    a non-metallic closure covering the top opening, wherein an enhancement formed at the non-metallic closure, wherein the enhancement is of a directional open cone extending inward.

2. The EMF protection device of claim 1, further comprising:
    a combination of metallic and non-metallic materials covering part or entirety of the top opening.

3. The EMF protection device of claim 1, further comprising:
    a pattern of the metallic bottom and the metallic side comprises a wire mesh or a metal plate.

4. The EMF protection device of claim 1, further comprising:
    multiple enhancements formed at the non-metallic closure and arranged in an array, wherein the enhancements form a cone array comprising multiple cones.

5. The EMF protection device of claim 4, wherein each cone has a diameter of 0.1 inches to 5 inches.

6. The EMF protection device of claim 4, wherein each cone has a depth of 0.1 inches to 5 inches.

7. The EMF protection device of claim 1, further comprising:
    a base structure comprising an extended portion extending out of the metallic bottom.

8. The EMF protection device of claim 7, wherein the base structure comprising conducting materials including Mn, Zn, Al, Cu, Fe, or a combination thereof.

9. The EMF protection device of claim 1, where a material of at least one of the metallic bottom and the metallic side comprise conducting materials including Mn, Zn, Al, Cu, Fe, or a combination thereof.

10. The EMF protection device of claim 1, where the shape of the EMF protection device is a cylinder, cone, sphere, or any combination thereof.

11. The EMF protection device of claim 1, wherein the metallic bottom, the metallic side, and the top opening form a telescopic cylinder.

12. The EMF protection device of claim 11, wherein an area of the metallic bottom is larger than that of the top opening.

13. The EMF protection device of claim 1, wherein the EMF protection device is configured to surround a wireless device or wireless devices including a cellphone, a tablet, or a wearable device.

14. The EMF protection device of claim 13, further comprising:
    a wired or wireless charger configured to charge the battery of the wireless devices placed inside the EMF protection device.

15. The EMF protection device of claim 1, further comprising:
    a lighting configured to serve as a lamp or a night light.

16. The EMF protection device of claim 1, further comprising:
    a position sensor configured to alert the user in response to the EMF protection device is placed in a wrong direction.

17. The EMF protection device of claim 1, wherein the signal is a cellular, WiFi, or Bluetooth signal.

18. The EMF protection device of claim 1, further comprising:
    a housing; and sections of a retractable body, wherein the EMF protection device is configured to be movable along a depth direction from a retracted position in which the sections of the retractable body are all contained by the housing, a semi-extended position in which parts of the sections of the retractable body are contained by the housing, and a fully extended position in which all sections of the retractable body extend upwardly.

\* \* \* \* \*